(12) United States Patent
Zhu

(10) Patent No.: US 10,497,819 B2
(45) Date of Patent: Dec. 3, 2019

(54) EFFICIENT BACK SURFACE FIELD PASTE FOR CRYSTALLINE SILICON SOLAR CELLS AND PREPARATION METHOD THEREOF

(71) Applicant: NANTONG T-SUN NEW ENERGY CO., LTD., Nantong, Jiangsu (CN)

(72) Inventor: Peng Zhu, Jiangsu (CN)

(73) Assignee: NANTONG T-SUN NEW ENERGY CO., LTD., Nantong, Jiangsu (CN)

( * ) Notice: Subject to any disclaimer, the term of this patent is extended or adjusted under 35 U.S.C. 154(b) by 129 days.

(21) Appl. No.: 15/571,402

(22) PCT Filed: Apr. 11, 2017

(86) PCT No.: PCT/CN2017/080015
§ 371 (c)(1),
(2) Date: Nov. 2, 2017

(87) PCT Pub. No.: WO2018/040564
PCT Pub. Date: Mar. 8, 2018

(65) Prior Publication Data
US 2019/0157476 A1    May 23, 2019

(30) Foreign Application Priority Data

Aug. 30, 2016  (CN) .......................... 2016 1 0756143

(51) Int. Cl.
*H01L 31/0224* (2006.01)
*H01L 31/0216* (2014.01)
*H01B 1/22* (2006.01)
*H01B 1/02* (2006.01)

(52) U.S. Cl.
CPC ..... *H01L 31/022441* (2013.01); *H01B 1/023* (2013.01); *H01B 1/22* (2013.01); *H01L 31/0224* (2013.01); *H01L 31/02167* (2013.01); *H01L 31/022425* (2013.01)

(58) Field of Classification Search
CPC .... H01L 31/002441; H01L 31/022425; C09D 5/24
USPC ............................................ 136/256; 438/98
See application file for complete search history.

(56) References Cited

U.S. PATENT DOCUMENTS

| | | | | |
|---|---|---|---|---|
| 2013/0273687 A1* | 10/2013 | Akimoto | ........... | H01L 31/02244 438/98 |
| 2014/0190560 A1* | 7/2014 | Inaba | ................ | H01L 31/02242 136/256 |
| 2014/0290729 A1* | 10/2014 | Kondo | .............. | H01L 31/02242 136/256 |
| 2017/0148936 A1 | 5/2017 | Zhu | | |

FOREIGN PATENT DOCUMENTS

| | | | |
|---|---|---|---|
| CN | 102737751 A | 10/2012 | |
| CN | 104637568 A | 5/2015 | |
| CN | 106098149 A | 11/2016 | |
| JP | 2014241348 A | 12/2014 | |
| JP | 2015191971 A | 11/2015 | |

OTHER PUBLICATIONS

International Search Report and Written Opinion of PCT/CN2017/080015 dated Apr. 11, 2017, 15 pages (Chinese).

\* cited by examiner

*Primary Examiner* — Khanh T Nguyen
(74) *Attorney, Agent, or Firm* — Rankin, Hill & Clark LLP

(57) ABSTRACT

An efficient back surface field paste for used crystalline silicon solar cells and its preparation method include Paste A and Paste B. Paste A comprises by weight: 50-60% aluminum powder, 2-6% inorganic binder, 10-20% organic binder, 16-26% organic solvent and 2-8% additives, and the sum of weight percentages of each component is 100%. Paste B comprises by weight: 85-90% aluminum powder, 0.1-1% inorganic binder, 1-5% organic binder, 2-8% organic solvent and 1-3% additives, and the sum of weight percentages of each component is 100%.

10 Claims, No Drawings

EFFICIENT BACK SURFACE FIELD PASTE FOR CRYSTALLINE SILICON SOLAR CELLS AND PREPARATION METHOD THEREOF

FIELD OF THE INVENTION

The invention relates to an aluminum paste used for crystalline silicon solar cells, and more particularly, to an efficient back surface field paste for used crystalline silicon solar cells and a preparation method thereof.

BACKGROUND OF THE INVENTION

A solar cell is a device that responds to light and converts light energy into electric power. A solar cell, also called a photovoltaic cell, is a semiconductor device with energy conversion function based on semiconductor material. It is the most important component of solar photovoltaic power generation. When sunlight shines upon the interface layer of a semiconductor the P-N junction, new hole-electron pairs will be induced. Inside a P-N junction, holes flow from the N region to the P region and electrons flow from the P region to the N region under the influence of the P-N junction electric field. An electric current forms once the circuit is switched on. Such an effect is called "photovoltaic effect", which is the working principle of solar cells, so a solar cell is also called a "photovoltaic cell".

With the development of the photovoltaic industry, more and more attention has been paid to the photovoltaic efficiency recently. Therefore, it is very necessary to develop efficient conventional aluminum pastes, and to upgrades the photovoltaic efficiency to the next level.

SUMMARY OF THE INVENTION

The object of the present invention is to provide an efficient conventional back surface field paste which may be used for crystalline silicon solar cells.

Another object of the present invention is to provide a method for preparing efficient conventional back surface field pastes. The main characteristic of the back surface field aluminum paste for the crystalline silicon solar cells disclosed in the invention is that the dual function of the aluminum paste becomes more obvious, and the photoelectric conversion efficiency is improved effectively by adjusting the formula of the paste, while the existing manufacturing process is not changed as much as possible.

The object of the invention can be attained by the following technical scheme: an efficient back surface field paste used for crystalline silicon solar cells which comprises Paste A and Paste B.

Paste A comprises by weight: 50-60% aluminum powder, 2-6% inorganic binder, 10-20% organic binder, 16-26% organic solvent and 2-8% additive, and the sum of weight percentages of each component is 100%.

Paste B comprises by weight: 85-90% aluminum powder, 0.1-1% inorganic binder, 1-5% organic binder, 2-8% organic solvent and 1-3% additive, and the sum of weight percentages of each component is 100%.

Preferably, the aluminum powder used in Paste A is spherical aluminum powder with a purity of more than 99.999%, an average particle size of 0.1-1 μm and a particle size span of 0.2-0.6; the aluminum powder used in Paste B is spherical aluminum powder with a purity of more than 99.99%, an average particle size of 10-15 μm and a particle size span of 1.5-3.0.

Preferably, the additive is a copolymer solution, which has strong dispersing, wetting and leveling effects.

Preferably, Paste A is a highly active back surface field paste, wherein the inorganic binder used is a lead- and bismuth-containing mixture with a low softening point of 250-400° C. and a high activity; Paste B is a back surface field aluminum paste with a low activity and a good passivation effect, wherein the inorganic binder used is a zinc- and vanadium-containing mixture with a high activity and a high softening point of about 450-650° C.

Preferably, the inorganic binder in Paste A has a particle size D50 of 1.0-2.0 μm, a particle size span of 0.7-1.5 and a relatively high activity; the inorganic binder in Paste B has a particle size D50 of 3.0-5.0 μm, a particle size span of 2.0-3.0 and a relatively low activity.

Preferably, the organic binder is a mixture mainly composed of resin and organic solvents, wherein the ratio by weight of resin to organic solvent is 1:5-1:20. The resin used is one or more members of the group consisting of phenolic resin, phenolic-modified resin, polyvinyl chloride resin, polyamide resin, epoxy resin and ethyl cellulose resin. Preferably, the resin used in Paste A should have a good thixotropy, and the resin used in Paste B should be vulnerable to decomposition.

Preferably, when preparing electrode with screen printing, Paste A is screen printed with a 325 mesh screen printing plate on a 156 mm×156 mm polycrystalline silicon wafer on which a back electrode has been printed, so as to form a highly active aluminum back surface, and then the polycrystalline silicon wafer is dried in a muffle furnace at 160° C. for 4 min. The printing weight of Paste A on every wafer is controlled between 0.35-0.45 g. Paste B is screen printed with a 280 mesh screen printing plate on a 156 mm×156 mm polycrystalline silicon wafer on which Paste A has been printed and dried, so as to form a well passivated aluminum back surface, and then the polycrystalline silicon wafer is dried in a muffle furnace at 240° C. for 2 min. The printing weight of Paste B on every wafer is controlled between 0.85-1.00 g.

The preparation method of the efficient back surface field paste used for crystalline silicon solar cells includes the following steps:

(1) Preparation of an inorganic binder: For the preparation of an inorganic binder in Paste A, raw materials for the inorganic binder in Paste A are mixed, and the mixture is put into a porcelain crucible, melted in high temperature furnace, quenched by water, dried, ball milled to particle size D50 below 2 μm, and then dried, so as to obtain the inorganic binder which would be used in Paste A. For the preparation of an inorganic binder in Paste B, raw materials for the inorganic binder in Paste B are mixed, and the mixture is put into a porcelain crucible, melted in high temperature furnace, quenched by water, dried, ball milled to particle size D50 below 5 μm, and then dried, so as to obtain the inorganic binder which would be used in Paste B;

(2) Preparation an organic binder: resin and organic solvent are mixed at a ratio by weight of resin to organic solvent between 1:5 to 1:20, and then the mixture is put into a high-speed dispersion machine, stirred for 30-60 min, so that the resin is dissolved, and thus a transparent and homogeneous organic binder is obtained; the used resin is one or more members of the group consisting of phenolic resin, phenolic-modified resin, polyvinyl chloride resin, polyamide resin, epoxy resin and ethyl cellulose resin; Preferably, the resin used in Paste A should have a good thixotropy, and the resin used in Paste B should be vulnerable to decomposition;

(3) Preparation of aluminum pastes without being grinded: the preparation method of Paste A with being grinded comprises: 50-60% aluminum powder, 2-6% inorganic binder, 10-20% organic binder, 16-26% organic solvent and 2-8% additive, the sum of weight percentages of each component being 100%, are weighed and mixed well with a dispersion machine; the preparation method of Paste B without being grinded comprises: 85-95% aluminum powder, 0.1-1.0% inorganic binder, 1-5% organic binder, 2-8% organic solvent and 1-3% additive, are weighed and mixed well with a dispersion machine;

(4) Preparation of finished products (Paste A and Paste B): the above mixtures Paste A without being grinded and Paste B without being grinded are grinded respectively by the use of a three roller grinding machine to a particle size of 0.5-16 µm, so as to obtain all-aluminum back surface field aluminum pastes, Paste A and Paste B. The viscosities of Paste A and Paste B are adjusted and controlled by adding organic solvents. Particularly, the viscosity of Paste A is controlled within 14-21 Pa·s, and the fineness of Paste A is controlled within 0.1-1.5 µm, while the viscosity of Paste B is controlled within 27-34 Pa s, and the fineness of Paste B is controlled within 6-16 µm.

Beneficial Effects: Specific additive used in the invention can reduce the surface energy of aluminum powder, eliminate surface charge and surface attraction of aluminum powder, and increase adhesion between aluminum and other mediums. Thus, aluminum powder can be prevented from losing its activity in the air due to deterioration, the dispersion of the aluminum particles is improved, and thus the probability of aluminum powder agglomeration is reduced.

Compared with the conventional solar cell production process wherein the conventional aluminum paste is screen printed by a screen printing machine and dried by a drier, the invention only need one more screen printing machine and one more drier.

When the paste of the invention is used on the conventional aluminum back surface field of monocrystalline silicon solar cells, the thickness of back surface field (BSF) layer can be increased by increasing the activity of the paste; the hole-electron recombination rate is effectively reduced and the collection rate of minority carriers is improved by increasing the passivation of the aluminum layer. Therefore, the open circuit voltage is raised and the antireflection effect is improved. As a result, the average photovoltaic conversion efficiency is more than 20.5%.

DETAILED DESCRIPTION OF THE PREFERRED EMBODIMENTS

The present invention is described in detail with some embodiments.

The efficient back surface field paste used for crystalline silicon solar cells of the invention comprises Paste A and Paste B. Paste A comprises by weight: 50-60% aluminum powder, 2-6% inorganic binder, 10-20% organic binder, 16-26% organic solvent and 2-8% additive, the sum of weight percentages of each component being 100%. Paste B comprises by weight: 85-90% aluminum powder, 0.1-1% inorganic binder, 1-5% organic binder, 2-8% organic solvent and 1-3% additive, the sum of weight percentages of each component being 100%.

The aluminum powder used in Paste A is spherical aluminum powder with a purity of more than 99.999%, an average particle size of 0.1-1 µm and a particle size span of 0.2-0.6; the aluminum powder used in Paste B is spherical aluminum powder with a purity of more than 99.99%, an average particle size of 10-15 µm and a particle size span of 1.5-3.0.

The additive used is a copolymer solution, which has strong dispersing, wetting and leveling effects. The purity of the copolymer is more than 99%.

Paste A is a highly active back surface field paste, wherein the inorganic binder used is a lead- and bismuth-containing mixture with a low softening point of 250-400° C. and a high activity; Paste B is a back surface field aluminum paste with a low activity and a good passivation effect, wherein the inorganic binder used is a zinc- and vanadium-containing mixture with a high activity and a high softening point of about 450-650° C.

The inorganic binder in Paste A has a particle size D50 of 1.0-2.0 µm, a particle size span of 0.7-1.5 and a relatively high activity; the inorganic binder in Paste B has a particle size D50 of 3.0-5.0 µm, a particle size span of 2.0-3.0 and a relatively low activity.

The organic binder used is a mixture mainly composed of resin and organic solvents, wherein the ratio by weight of resin to organic solvent is 1:5-1:20. The resin used is one or more members of the group consisting of phenolic resin, phenolic-modified resin, polyvinyl chloride resin, polyamide resin, epoxy resin and ethyl cellulose resin. Preferably, the resin used in Paste A should have a good thixotropy, and the resin used in Paste B should be vulnerable to decomposition.

The preparation method of the aluminum paste of the present invention is described in detail with a few concrete embodiments as below.

Embodiment 1

(1) Preparation of an inorganic binder: For the preparation of an inorganic binder in Paste A, raw materials for the inorganic binder in Paste A are mixed, and the mixture is put into a porcelain crucible, melted in high temperature furnace, quenched by water, dried, ball milled to D50 below 2 µm, and then dried, so as to obtain the inorganic binder. For the preparation of an inorganic binder in Paste B, raw materials for the inorganic binder in Paste B are mixed, and the mixture is put into a porcelain crucible, melted in high temperature furnace, quenched by water, dried, ball milled to D50 below 5 µm, and then dried, so as to obtain the inorganic binder.

(2) Preparation an organic binder: the organic binder for Past A comprises 17% ethyl cellulose resin and 83% organic solvent are mixed, and then the mixture is put into a dispersion machine, stirred at a rotation rate of 1800 r/min for 45 min, so that the resin is dissolved, and thus a transparent and homogeneous organic binder is obtained; the organic binder for Past B comprises 10% epoxy resin and 90% organic solvent are mixed, and then the mixture is put into a dispersion machine, stirred at a rotation rate of 1800 r/min for 30 min, so that the resin is dissolved, and thus a transparent and homogeneous organic binder is obtained.

(3) Preparation of the all-Aluminum Back Surface Field Paste:

Paste A: 58% aluminum powder, 2.8% inorganic binder, 16% organic binder, 20% organic solvent and 3.2% additive are weighed and mixed well with a dispersion machine, and then the mixture are grinded by the use of a three roller grinding machine to a particle size of 0.1-1.5 µm, so as to obtain Paste A.

Paste A is screen printed with a 325 mesh back surface field screen printing plate on a 156 mm×156 mm polycrystalline silicon wafer on which a back electrode has been printed, so as to form a highly active aluminum back surface, and then the polycrystalline silicon wafer is dried in a muffle furnace at 160° C. for 4 min.

Paste B: 88% aluminum powder, 0.8% inorganic binder, 3.2% organic binder, 6.2% organic solvent and 1.8% additive are weighed and mixed well with a dispersion machine, and then the mixture are grinded by the use of a three roller grinding machine to a particle size of 8-16 µm, so as to obtain Paste B.

Paste B prepared as above is screen printed with a 280 mesh screen printing plate on a 156 mm×156 mm polycrystalline silicon wafer on which Paste A has been printed and dried, so as to form a well passivated aluminum back surface, and then the polycrystalline silicon wafer is dried in a muffle furnace at 240° C. for 2 min.

After being dried at 240° C. for 2 min., the back surface field aluminum-containing layer does not fall off. A silver paste is printed on the front surface of a solar cell wafer, and is sintered in an infrared fast response mesh belt furnace. The sintering peak temperature is 790-810° C. The properties of the prepared paste are tested and found to meet application requirements.

The testing of electrical properties of the solar cell obtained from the above Embodiment is carried out. The testing results are shown in Table 1.

TABLE 1

Testing Results of Electrical Properties

| Open Circuit Voltage mV | Short Circuit Current A | Series Resistance $\Omega$ | Parallel Resistance $\Omega$ | Filling Factor % | conversion efficiency % |
|---|---|---|---|---|---|
| 651.31 | 9.5046 | 0.001952 | 404.4909 | 80.83 | 20.648 |

The invention is not limited to the above preferred embodiments. Various other products made with the identical or similar technologies disclosed in the invention by persons skilled in the art who are enlightened from the invention, no matter any modifications or changes in shape or structure, are within the scope of the invention.

I claim:

1. A an efficient back surface field paste used for crystalline silicon solar cells, comprising Paste A and Paste B, wherein
    Paste A comprises by weight: 50-60% aluminum powder, 2-6% inorganic binder, 10-20% organic binder, 16-26% organic solvent and 2-8% additives, and the sum of weight percentages of each component is 100%, and
    Paste B comprises by weight: 85-90% aluminum powder, 0.1-1% inorganic binder, 1-5% organic binder, 2-8% organic solvent and 1-3% additives, and the sum of weight percentages of each component is 100%.

2. A an efficient back surface field paste used for crystalline silicon solar cells according to claim 1, wherein the aluminum powder used in Paste A is spherical aluminum powder with a purity of more than 99.999%, an average particle size of 0.1-1 µm and a particle size span of 0.2-0.6; the aluminum powder used in Paste B is spherical aluminum powder with a purity of more than 99.99%, an average particle size of 10-15 µm and a particle size span of 1.5-3.0.

3. A an efficient back surface field paste used for crystalline silicon solar cells according to claim 1, wherein the additive is a copolymer solution, which has strong dispersing, wetting and leveling effects.

4. A an efficient back surface field paste used for crystalline silicon solar cells according to claim 1, wherein Paste A is a highly active back surface field paste, wherein the inorganic binder used is a lead- and bismuth-containing mixture with a low softening point of 250-400° C. and a high activity; Paste B is a back surface field aluminum paste with a low activity and a good passivation effect, wherein the inorganic binder used is a zinc- and vanadium-containing mixture with a high activity and a high softening point of 450-650° C.

5. A an efficient back surface field paste used for crystalline silicon solar cells according to claim 1, wherein the inorganic binder in Paste A has a particle size D50 of 1.0-2.0 µm, a particle size span of 0.7-1.5 and a higher activity; the inorganic binder in Paste B has a particle size D50 of 3.0-5.0 µm, a particle size span of 2.0-3.0 and a lower activity.

6. A an efficient back surface field paste used for crystalline silicon solar cells according to claim 1, wherein the organic binder is a mixture mainly composed of resin and organic solvents, wherein the ratio by weight of resin to organic solvent is 1:5-1:20; the resin used is one or more members of the group consisting of phenolic resin, phenolic-modified resin, polyvinyl chloride resin, polyamide resin, epoxy resin and ethyl cellulose resin.

7. A an efficient back surface field paste used for crystalline silicon solar cells according to claim 6, wherein the resin used in Paste A has a good thixotropy, and the resin used in Paste B is vulnerable to decomposition.

8. A an efficient back surface field paste used for crystalline silicon solar cells according to claim 1, wherein when preparing electrode with screen printing, Paste A is screen printed with a 325 mesh screen printing plate on a 156 mm×156 mm polycrystalline silicon wafer on which a back electrode has been printed to form a highly active aluminum back surface, and then the polycrystalline silicon wafer is dried in a muffle furnace at 160° C. for 4 min; the printing weight of Paste A on every wafer being controlled between 0.35-0.45 g, and Paste B is screen printed with a 280 mesh screen printing plate on a 156 mm×156 mm polycrystalline silicon wafer on which Paste A has been printed and dried, so as to form a well passivated aluminum back surface, and then the polycrystalline silicon wafer is dried in a muffle furnace at 240° C. for 2 min, the printing weight of Paste B on every wafer being controlled between 0.85-1.00 g.

9. The preparation method of the efficient back surface field paste used for crystalline silicon solar cells according to claim 1, including the following steps:
    (1) Preparation of an inorganic binder for the preparation of an inorganic binder in Paste A, raw materials for the inorganic binder in Paste A are mixed, and the mixture is put into a porcelain crucible, melted in high temperature furnace, quenched by water, dried, ball milled to particle size D50 below 2 µm, and then dried to obtain the inorganic binder; for the preparation of an inorganic binder in Paste B, raw materials for the inorganic binder in Paste B are mixed, and the mixture is put into a porcelain crucible, melted in high temperature furnace, quenched by water, dried, ball milled to particle size D50 below 5 µm, and then dried to obtain the inorganic binder;
    (2) Preparation an organic binder resin and organic solvent are mixed at a ratio by weight of resin to organic solvent between 1:5 to 1:20, and then the mixture is put into a high-speed dispersion machine dispersion, stirred for 30-0 min, so that the resin is dissolved, and thus a transparent and uniform organic binder is obtained; the used resin is one or more members of the group consisting of phenolic resin, phenolic-modified resin, polyvinyl chloride resin, polyamide resin, epoxy resin and ethyl cellulose resin;

(3) Preparation of aluminum pastes without being grinded: the preparation method of Paste A with being grinded comprises: 50-60% aluminum powder, 2-6% inorganic binder, 10-20% organic binder, 16-26% organic solvent and 2-8% additive, the sum of weight percentages of each component being 100%, are weighed and mixed well with a dispersion machine; the preparation method of Paste B without being grinded comprises: 85-95% aluminum powder, 0.1-1.0% inorganic binder, 1-5% organic binder, 2-8% organic solvent and 1-3% additive, are weighed and mixed well with a dispersion machine;

(4) Preparation of finished products Paste A and Paste B: the above mixtures Paste A without being grinded and Paste B without being grinded are grinded respectively by the use of a three roller grinding machine to a particle size of 0.5-16 μm, so as to obtain all-aluminum back surface field aluminum pastes, Paste A and Paste B; the viscosities of Paste A and Paste B are adjusted and controlled by adding organic solvents; the viscosity of Paste A is controlled within 14-21 Pa·s, and the fineness of Paste A is controlled within 0.1-1.5 μm, while the viscosity of Paste B is controlled within 27-34 Pa·s, and the fineness of Paste B is controlled within 6-16 μm.

10. The preparation method according to claim 9, wherein the resin used in Paste A in the step (2) has a good thixotropy, and the resin used in Paste B in the step (2) is vulnerable to decomposition.

* * * * *